(12) United States Patent
Yoo

(10) Patent No.: US 7,839,480 B2
(45) Date of Patent: Nov. 23, 2010

(54) PHOTOMASK HAZE REDUCTION VIA VENTILATION

(75) Inventor: Chue San Yoo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 692 days.

(21) Appl. No.: 11/740,166

(22) Filed: Apr. 25, 2007

(65) Prior Publication Data

US 2008/0266534 A1      Oct. 30, 2008

(51) Int. Cl.
    *G03B 27/42*      (2006.01)
(52) U.S. Cl. .................. 355/30; 355/53; 355/75; 355/77; 359/509
(58) Field of Classification Search ........... 355/30, 355/53, 75, 77; 430/5; 250/492.2; 359/509; 378/34, 35
    See application file for complete search history.

(56) References Cited

U.S. PATENT DOCUMENTS

| | | | |
|---|---|---|---|
| 4,521,089 A * | 6/1985 | Bohl et al. ........... | 359/507 |
| 6,593,034 B1 | 7/2003 | Shirasaki | |
| 6,791,661 B2 | 9/2004 | Sato | |
| 6,803,161 B2 | 10/2004 | Shiraski | |
| 6,803,996 B2 | 10/2004 | Kamono | |
| 2002/0057425 A1 * | 5/2002 | Nakano ............... | 355/72 |
| 2003/0117609 A1 * | 6/2003 | Kamono .............. | 355/75 |

OTHER PUBLICATIONS

Jaehyuck Choi et al., "Real Time Analysis of the Haze Environment Trapped Between the Pellicle Film and the Mask Surface," Photomask, Bacus News, Sep. 2006, vol. 22, Issue 9, 12 pages.

* cited by examiner

*Primary Examiner*—Edward J Glick
*Assistant Examiner*—Colin Kreutzer
(74) *Attorney, Agent, or Firm*—Haynes and Boone, LLP

(57) ABSTRACT

Where a framed pellicle is mounted on a photomaps, the framed pellicle comprises a pellicle frame and a pellicle membrane coupled to the pellicle frame, the pellicle frame has first and second apertures each communicating a first space surrounded by the photomask and the framed pellicle with a second space outside of the framed pellicle, exposing a photoresist layer formed on a substrate by flowing gas from within the first space to outside the framed pellicle through the first aperture while simultaneously exposing the photoresist layer to ultraviolet light through the pellicle membrane and the photomask.

16 Claims, 5 Drawing Sheets

PHOTOMASK HAZE REDUCTION VIA VENTILATION

BACKGROUND

Photomasks, or reticles, are commonly used for photolithography in semiconductor manufacturing. Photomasks are typically made from very flat pieces of quartz or glass with a layer of chromium deposited on one side. The pattern being used to transfer an image to a wafer on BIM (Binary Mask) or PSM (Phase Shift Mask) masks during a photolithography processing. While contamination of photomasks has always been a problem, high precision masks, such as are used in photolithography having wavelengths equal to or less than 248 nm, are particularly susceptible to defects.

One type of photomask contamination is referred to as haze contamination. Haze contamination is a precipitant formed from mask cleaning chemical residual or impurity of fab or tool environment cross exposure. For example, when a solution including ammonium ($NH_4$) and sulfate ($SO_4$) is used to clean a photomask, contamination becomes apparent when the photomask is exposed to a short wavelength UV light, such as 248 or 193 nm.

One interesting aspect of the frame that has evolved over the years is the addition of a vent hole (also called a pressure relief valve, or PRV). Before the vent hole was added, photomasks shipped via air would experience pellicle inflation during high altitude (low pressure). The membrane would "puff up," sometimes to the point of making contact with the box lid in which it was stored. This contact would produce a scuff that rendered the mask useless before it ever made it into the wafer fabrication cleanroom. To alleviate this problem, a small hole was drilled into the frame allowing the pressure to equalize between the encapsulated air under the pellicle membrane and the ambient air. Since the statistical change that a small particle could in fact be sucked through the hole during pressure equalization is nonzero, holes can either be covered with a filter material or be cut as a tortuous path through the frame, or both. (this may be for FIG. 2)

UV laser applied on the mask with pellicle creates high energy environment in the space trapped between the pellicle and the mask surface. This environment is filled with outgassed chemicals from pellicle materials and highly reactive oxygen radicals and ozone produced during the laser exposure, creating an ideal nest for photochemical reactions that could possibly induce the haze defect formation on the mask surface.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
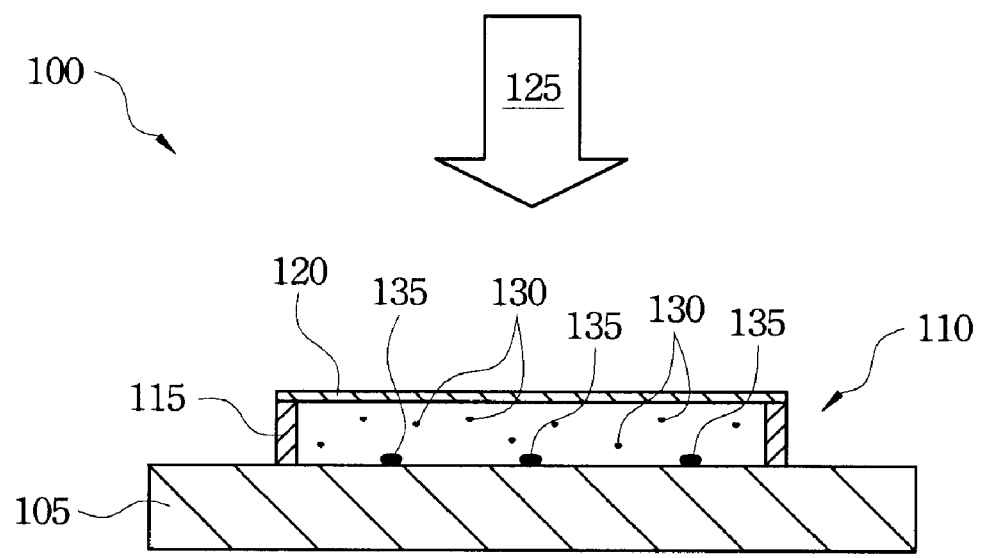
FIG. 1 is a sectional view of a conventional apparatus.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of a conventional apparatus 100 comprising a photomask substrate 105 and a framed pellicle 110 mounted thereon, wherein the framed pellicle 110 includes a pellicle frame 115 and a pellicle membrane 120 coupled to the pellicle frame 115. An exposure light 125 directed through the pellicle membrane 120 and the photomask substrate 105 can generate active chemical species 130. The active chemical species 130 can collect to form a haze or other defect formations 135 on the photomask substrate 105, which can adversely affect exposure processing.

Figure 2:
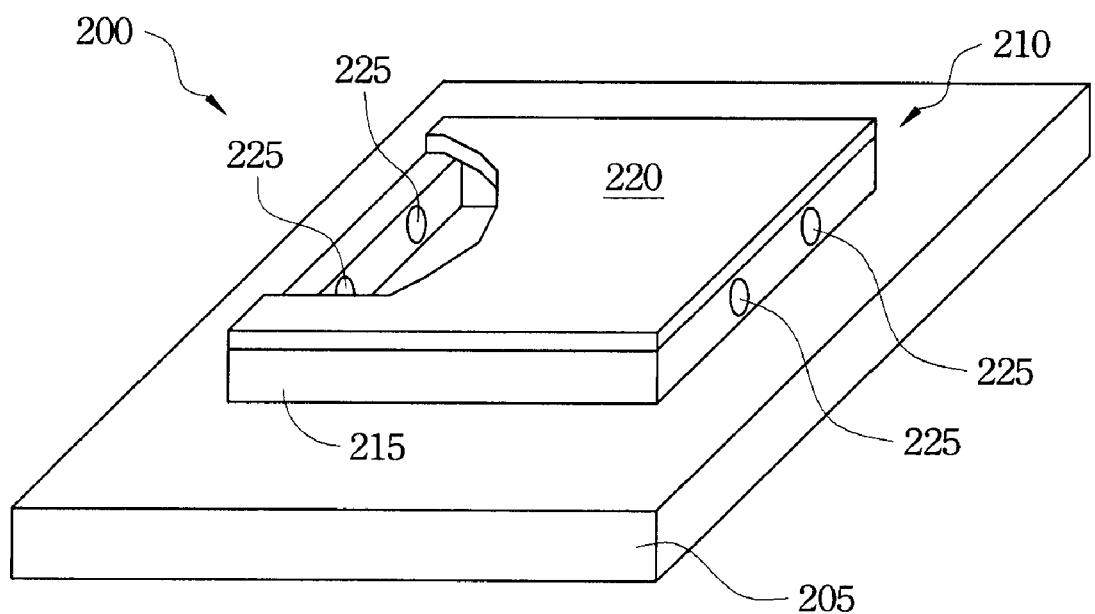
FIG. 2 is a perspective view of a conventional apparatus.

Referring to FIG. 2, illustrated is a perspective view of a conventional apparatus 200 comprising a photomask substrate 205 and a framed pellicle 210 mounted thereon, wherein the framed pellicle 210 includes a pellicle frame 215 and a pellicle membrane 220 coupled to the pellicle frame 215. The apparatus 200 may be substantially similar to the apparatus 100 shown in FIG. 1. However, a portion of the pellicle membrane 220 is not shown in FIG. 2 in order to demonstrate the location of apertures 225 included in the pellicle frame 215. The apertures 225 fluidicly connect and/or otherwise connect or communicate the space inside the framed pellicle 210 with the space outside the framed pellicle 210.

Figure 3:
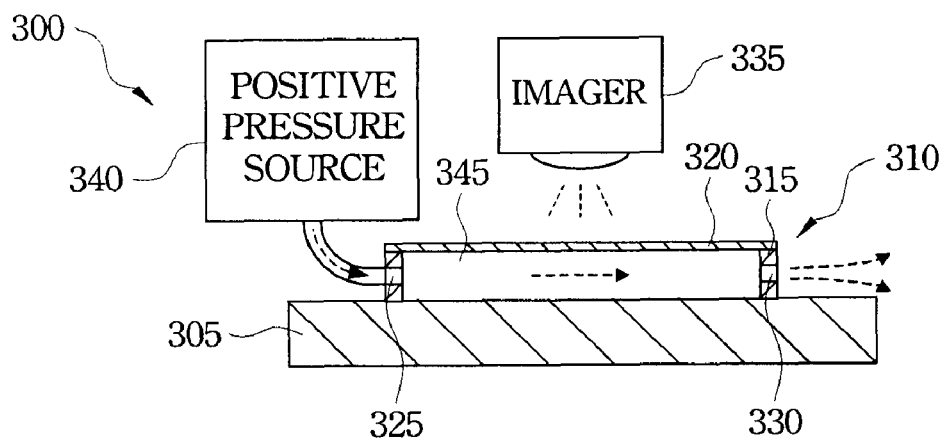
FIG. 3 is a schematic, sectional view of apparatus according to one or more aspects of the present disclosure.

Referring to FIG. 3, illustrated is a schematic, sectional view of an exposure apparatus 300 according to one or more aspects of the present disclosure. The exposure apparatus 300 is configured for use in exposing a photomask substrate 305 to ultraviolet light through a framed pellicle 310 mounted on the photomask substrate 305. The substrate 305 and framed pellicle 310 may be substantially similar to those shown in FIGS. 1 and/or 2. For example, the framed pellicle 310 includes a pellicle frame 315 and a pellicle membrane 320 coupled to the pellicle frame 315, and the pellicle frame 315 includes a first aperture 325 and a second aperture 330.

The apparatus 300 includes an imager 335 and a ventilator comprising a positive pressure gas source 340. The positive pressure gas source 340 is configured to create gas flow or flux through the space 345 inside the framed pellicle 310 and photomask substrate 305 by forcing gas into the first aperture 325. Because the volume of the space defined inside the framed pellicle 310 and the photomask substrate 305 is substantially constant, the gas forced into the space 345 through the first aperture 325 flows through the space 345 and then out through the second aperture 330. In FIG. 3, the gas flow is depicted by dashed arrows. During operation, the ventilator is configured to maintain this gas flux during exposure of 193 nm or other ultraviolet light through the framed pellicle 310 and the photomask substrate 305 by the imager 335. Consequently, any active chemical species or other photon-excited chemicals generated during exposure processing that utilizes the imager 335 will be forced out of the space 345 before being allowed to settle on the photomask substrate 305, form haze on the photomask substrate 305, or otherwise adversely affect the exposure processing. In an exemplary embodiment, the gas supplied by the positive pressure gas source 340 is or comprises nitrogen ($N_2$), argon (Ar) and/or other inert gas compositions, and may be supplied at a flow rate ranging between about 1 sccm and about 1000 sccm, although other flow rates may also be within the scope of the present disclosure.

Figure 4:
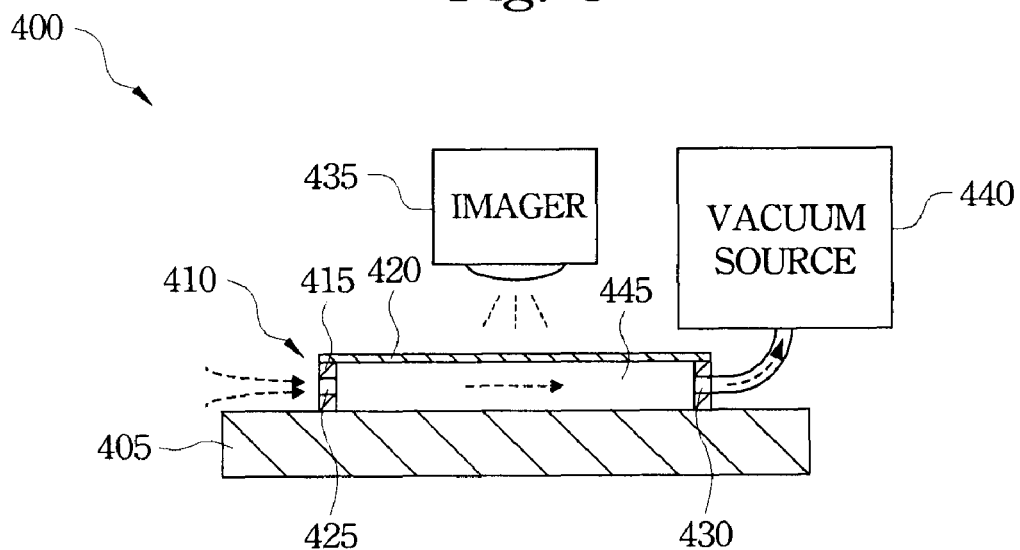
FIG. 4 is a schematic, sectional view of apparatus according to one or more aspects of the present disclosure.

Referring to FIG. 4, illustrated is a schematic, sectional view of an exposure apparatus 400 according to one or more aspects of the present disclosure. The exposure apparatus 400 is configured for use in exposing a photomask substrate 405 to ultraviolet light through a framed pellicle 410 mounted on the photomask substrate 405. The substrate 405 and framed pellicle 410 may be substantially similar to those shown in FIGS. 1 and/or 2. For example, the framed pellicle 410 includes a pellicle frame 415 and a pellicle membrane 420 coupled to the pellicle frame 415, and the pellicle frame 415 includes a first aperture 425 and a second aperture 430.

The apparatus 400 includes an imager 435 and a ventilator comprising a vacuum source 440. The vacuum source 440 is configured to create gas flow or flux through the space 445 inside the framed pellicle 410 and photomask substrate 405 by drawing gas through the second aperture 430. In FIG. 4, the gas flow is depicted by dashed arrows. During operation, the ventilator is configured to maintain this gas flux during exposure of 193 nm or other ultraviolet light through the framed pellicle 410 and the photomask substrate 405 by the imager 435. Consequently, any active chemical species or other photon-excited chemicals generated during exposure processing that utilizes the imager 435 will be drawn out of the space 445 before being allowed to settle on the photomask substrate 405, form haze on the photomask substrate 405, or otherwise adversely affect the exposure processing. In an exemplary embodiment, the first aperture 425 may be blocked or filtered to prevent additional contaminants from being drawn into the space 445 by the vacuum or decreased pressure generated in the space 445 by operation of the vacuum source 440.

Figure 5:
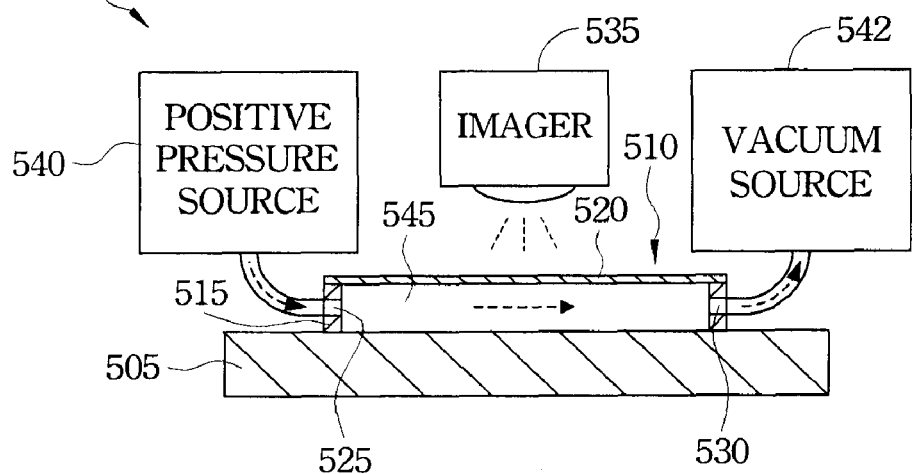
FIG. 5 is a schematic, sectional view of apparatus according to one or more aspects of the present disclosure.

Referring to FIG. 5, illustrated is a schematic, sectional view of an exposure apparatus 500 according to one or more aspects of the present disclosure. The exposure apparatus 500 is configured for use in exposing a photomask substrate 505 to ultraviolet light through a framed pellicle 510 mounted on the photomask substrate 505. The substrate 505 and framed pellicle 510 may be substantially similar to those shown in FIGS. 1 and/or 2. For example, the framed pellicle 510 includes a pellicle frame 515 and a pellicle membrane 520 coupled to the pellicle frame 515, and the pellicle frame 515 includes a first aperture 525 and a second aperture 530.

The apparatus 500 includes an imager 535 and a ventilator comprising a positive pressure gas source 540 and a vacuum source 542. The positive pressure gas source 540 and the vacuum source 542 are collectively configured to cooperate to create gas flow or flux through the space 545 inside the framed pellicle 510 and photomask substrate 505 by simultaneously forcing gas through the first aperture 525 and drawing gas through the second aperture 530. In FIG. 5, the gas flow is depicted by dashed arrows. During operation, the ventilator is configured to maintain this gas flux during exposure of 193 nm or other ultraviolet light through the framed pellicle 510 and the photomask substrate 505 by the imager 535. Consequently, any active chemical species or other photon-excited chemicals generated during exposure processing that utilizes the imager 535 will be forced and/or drawn out of the space 545 before being allowed to settle on the photomask substrate 505, form haze on the photomask substrate 505, or otherwise adversely affect the exposure processing. In an exemplary embodiment, the gas supplied by the positive pressure gas source 540 is or comprises nitrogen ($N_2$) and/or other inert gas compositions.

Figure 6:
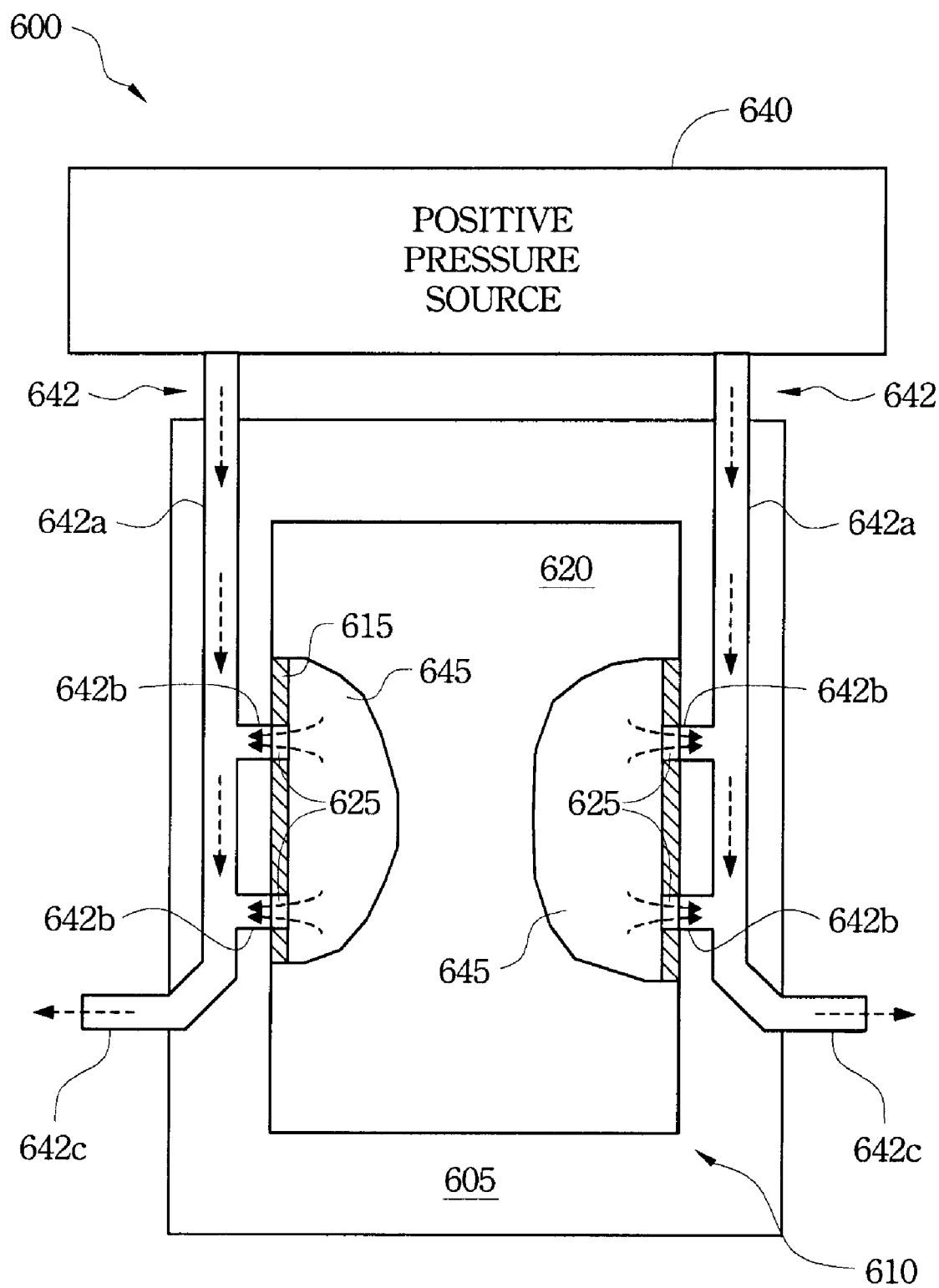
FIG. 6 is a schematic top view of apparatus according to one or more aspects of the present disclosure.

Referring to FIG. 6, illustrated is a schematic view of an exposure apparatus 600 according to one or more aspects of the present disclosure. The exposure apparatus 600 is configured for use in exposing a photomask substrate 605 to ultraviolet light through a framed pellicle 610 mounted on the photomask substrate 605. The substrate 605 and framed pellicle 610 may be substantially similar to those shown in FIGS. 1 and/or 2. For example, the framed pellicle 610 includes a pellicle frame 615 and a pellicle membrane 620 coupled to the pellicle frame 615, and the pellicle frame 615 includes a plurality of apertures 625.

The apparatus 600 includes a ventilator comprising a positive pressure gas source 640 and one or more "Bernoulli" devices 642. Each Bernoulli device 642 includes a tube 642a in fluidic communication with the positive pressure gas source 640, one or more inlets or other openings 642b each coupled to, adjacent or proximate a corresponding aperture 625 of the pellicle frame 615, and an exhaust 642c. The positive pressure gas source 640 is configured to direct gas flow through each tube 642a and out the corresponding exhaust 642c. Due to the Bernoulli principle, which provides that an increase in velocity in an ideal fluid occurs simultaneously with a decrease in pressure, the flow of gas past the openings 642b will create a low pressure region adjacent or proximate the apertures 625. Consequently, because the space 645 inside the framed pellicle 610 and photomask substrate 605 will thus be at a higher pressure relative to these low pressure regions, gas will be drawn from the space 645 through the apertures 625 and into the Bernoulli tubes 642a through the openings 642b. In FIG. 6, the gas flow is depicted by dashed arrows. During operation, the ventilator is configured to maintain this suction or vacuum effect during exposure of 193 nm or other ultraviolet light through the framed pellicle 610 and the photomask substrate 605 by an imager (which may also be a component of the apparatus 600 but is not shown in FIG. 6 for the purpose of clarity). Consequently, any active chemical species or other photon-excited chemicals generated during exposure processing that utilizes the imager will be drawn out of the space 645 before being allowed to settle on the photomask substrate 605, form haze on the photomask substrate 605, or otherwise adversely affect the exposure processing. In an exemplary embodiment, the gas supplied by the positive pressure gas source 640 is or comprises nitrogen ($N_2$) and/or other inert gas compositions.

In one or more of the exemplary embodiments depicted in FIGS. 3-6, described above, or otherwise within the scope of the present disclosure, the pellicle frame may have a number of apertures other than the number of apertures depicted in the figures. Moreover, the gas flow rate for any such embodiment may vary within the scope of the present disclosure. For example, the gas flow rate provided by one or more of the positive pressure gas sources described above or otherwise within the scope of the present disclosure may range between about 1 sccm and about 1000 sccm. The gas may be or comprise one or more inert gases, such as nitrogen or argon, among others. The photomask substrates may also vary within the scope of the present disclosure. In an exemplary embodiment, the photomask substrate is a quartz substrate having Cr patterns formed thereon.

Ventilators within the scope of the present disclosure may also be configured to assist in the alignment of the photomask substrate and/or the framed pellicle. For example, in the exemplary embodiment depicted in FIG. 6, the Bernoulli tubes 642, positive pressure gas source 640 and/or other components of the apparatus 600 may be oriented as a receptacle configured to receive the framed pellicle 610, such that when the apertures 625 of the framed pellicle 610 are positioned in fluidic communication with the openings 642*b* of the Bernoulli tubes 642 the framed pellicle 610 is accurately aligned for the exposure processing performed by the imager.

Moreover, the projection exposure apparatus or "imager" in the context of the present application may be or comprise an apparatus whose light source is an ultraviolet source such as a fluorine excimer laser. However, other imaging apparatus are also within the scope of the present disclosure.

Figure 7:
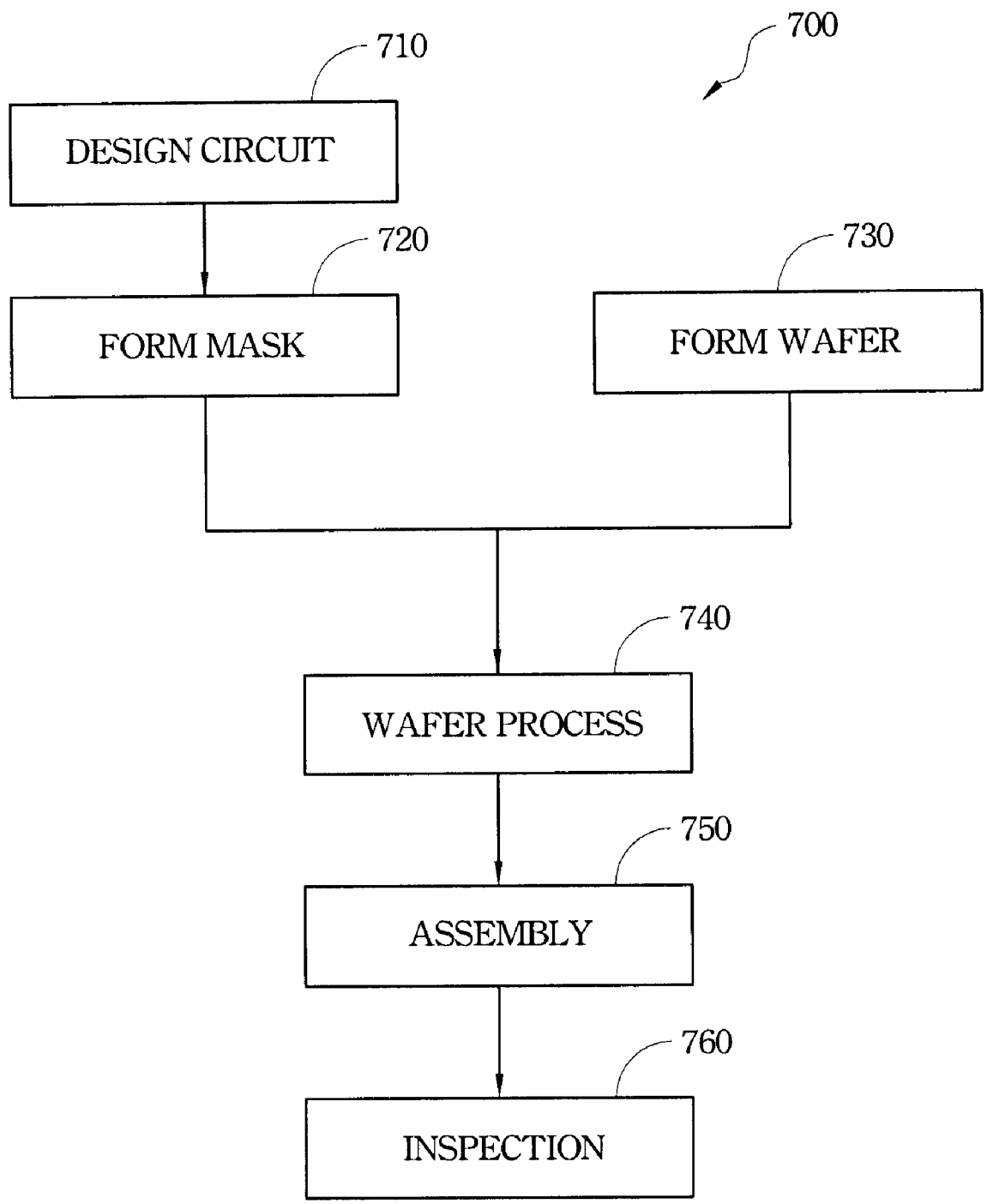
FIG. 7 is a flow-chart diagram of at least a portion of a method according to one or more aspects of the present disclosure.

Referring to FIG. 7, illustrated is a flow-chart diagram of at least a portion of a method 700 of manufacturing a semiconductor device according to one or more aspects of the present disclosure. The method 700 is an exemplary implementation of one or more aspects described above. The method 700 may include a step 710 during which the functions and performance of the device are designed. The method 700 may additionally or alternatively include a step 720 during which one or more masks are produced, possibly based on the design step 710. The method 700 may additionally or alternatively include a step 730 during which a substrate is produced, possibly forming the base of the device.

The method 700 includes a processing step 740 during which the pattern of a mask is exposed on the substrate using an exposure apparatus according to one or more of the aspects described above or otherwise within the scope of the present disclosure, such as the apparatus shown in one of FIGS. 3-6. For example, the pattern of the mask is exposed on the substrate while simultaneously forcing gas through the framed pellicle and/or drawing gas from the framed pellicle to reduce or eliminate the formation of haze or other defects on the photomask. The method 700 additionally or alternatively includes a device assembling step 750 which may include dicing, bonding and/or packaging, among other processes. The method 700 may additionally or alternatively include an inspection step 760.

Figure 8:
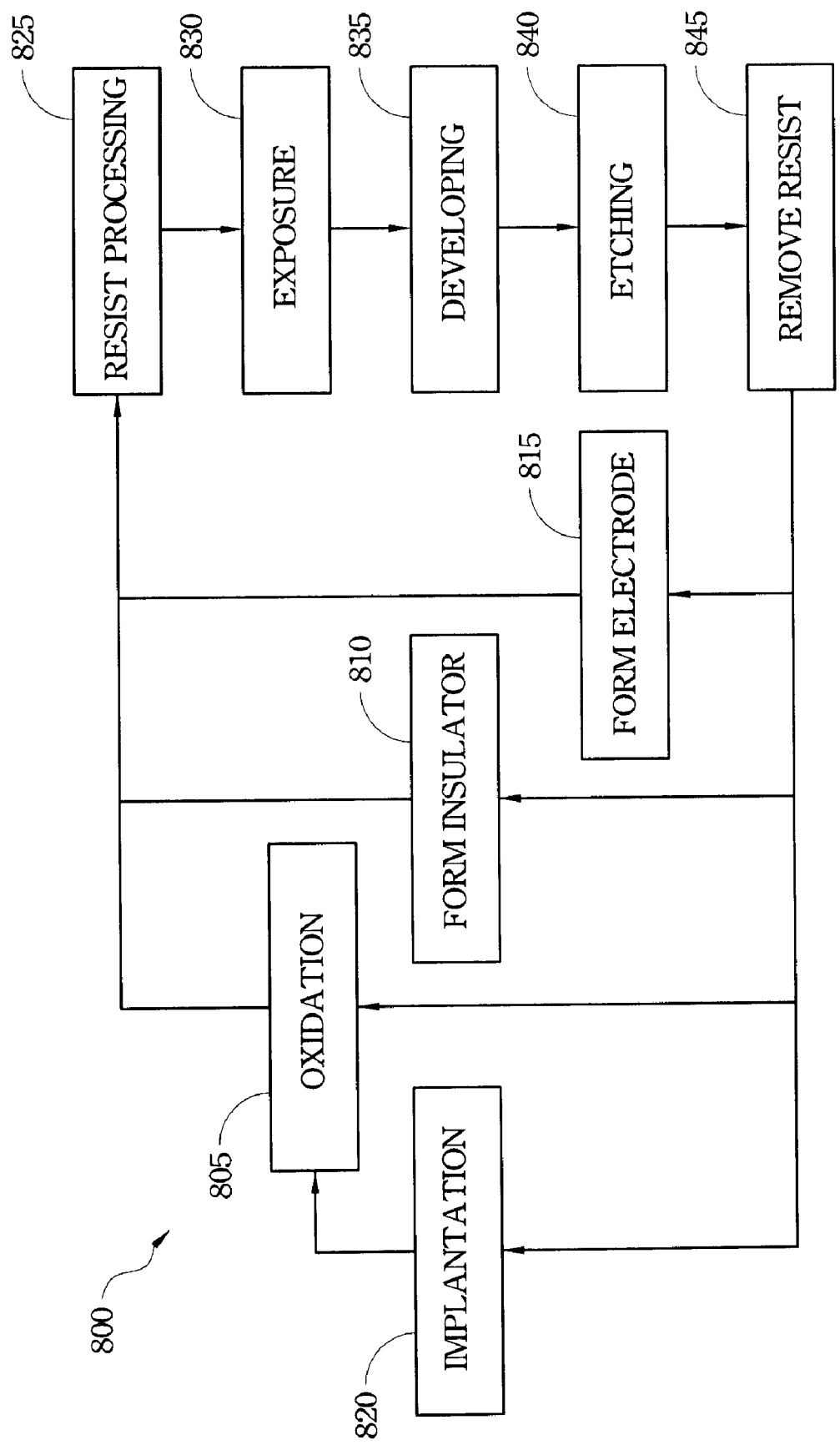
FIG. 8 is a flow-chart diagram of at least a portion of a method according to one or more aspects of the present disclosure.

Referring to FIG. 8, illustrated is a flow-chart diagram of at least a portion of a method 800 of manufacturing a semiconductor device according to one or more aspects of the present disclosure. The method 800 is an exemplary implementation of one or more aspects described above. The method 800 may include a step 805 during which a wafer surface is oxidized. In another step 810, an insulating film may be formed on the wafer surface, such as by chemical vapor deposition and/or other processes. In another step 815, an electrode may be formed on the wafer, such as by vapor deposition and/or other processes. In another step 820, ions may be implanted into the wafer. In another step 825, a photosensitive agent may be applied to the wafer.

In another step 830, an exposure apparatus according to one or more aspects of the present disclosure, such as the apparatus shown in one of FIGS. 3-6, transfers a circuit pattern to the wafer. For example, the circuit pattern may be transferred to the wafer while simultaneously forcing gas through the framed pellicle and/or drawing gas from the framed pellicle to reduce or eliminate the formation of haze or other defects on the photomask.

In another step 835, the exposed wafer may be developed. In another step 840, the resist may be etched except for the developed resist image. In another step 845, any unnecessary resist remaining after etching may be removed. A combination of these steps 805-840 may be repeated to form multiple circuit patterns on the wafer, possibly in the sequence depicted by the arrows shown in FIG. 8, among other sequences or series of steps also within the scope of the present disclosure.

In view of the above, it should be evident that the present disclosure introduces a method of exposing a photoresist layer on a substrate surface to ultraviolet light through a photomask. In an exemplary embodiment, the method includes: (1) mounting a framed pellicle on the photomask, the framed pellicle comprising a pellicle frame and a pellicle membrane coupled to the pellicle frame, the pellicle frame having first and second apertures each communicating a first space surrounded by the photomask and the framed pellicle with a second space outside of the framed pellicle; and (2) flowing gas from within the first space through the first aperture to outside the framed pellicle while simultaneously exposing the photoresist layer to ultraviolet light through the pellicle membrane and the photomask. Flowing gas from the first space through the first aperture to outside the framed pellicle may comprise communicating a positive pressure gas source with the second aperture. Flowing gas from the first space through the first aperture to outside the framed pellicle may alternatively comprise communicating a vacuum source with the first aperture. Flowing gas from the first space through the first aperture to outside the framed pellicle may alternatively comprise communicating a positive pressure gas source with the second aperture and communicating a vacuum source with the first aperture. Flowing gas from the first space through the first aperture to outside the framed pellicle may alternatively comprise communicating a positive pressure gas source with a tube external to the framed pellicle and having an opening proximate the first aperture such that gas flow within the tube creates a suction force urging gas from the first space through the first aperture and the opening and into the tube.

The present disclosure also provides an exposure apparatus comprising a chamber configured to accommodate a substrate and a photomask, wherein the substrate includes a photoresist layer located thereon, the photomask includes a framed pellicle mounted thereon, the framed pellicle includes a pellicle frame and a pellicle membrane coupled to the pellicle frame, and the pellicle frame includes first and second apertures each communicating a first space surrounded by the photomask and the framed pellicle with a second space outside of the framed pellicle. Such exposure apparatus also comprises an imager configured to direct an exposure light through the pellicle membrane and the photomask and onto the photoresist layer, and a ventilator configured to direct gas flow from within the first space to outside the framed pellicle through the first aperture while the imager simultaneously directs the exposure light through the pellicle membrane and photomask and onto the photoresist layer. The ventilator may include a positive pressure gas source in fluidic communication with the first aperture. The ventilator may include a vacuum source in fluidic communication with the second aperture. The ventilator may include a positive pressure gas source in fluidic communication with the first aperture and a vacuum source in fluidic communication with the second aperture. The exposure apparatus may further comprise a receptacle configured to receive the substrate. The exposure apparatus may further comprise a receptacle configured to receive the photomask. The ventilator may include a receptacle configured to align at least one of the photomask and the framed pellicle relative to the substrate. The ventilator may include a filter configured to filter gas flowing between the first and second spaces.

The present disclosure also introduces a ventilator for use with an exposure apparatus having a chamber and an imager, wherein the chamber is configured to accommodate a substrate and a photomask, the substrate includes a photoresist layer located thereon, the photomask includes a framed pellicle mounted thereon, the framed pellicle includes a pellicle frame and a pellicle membrane coupled to the pellicle frame, the pellicle frame includes first and second apertures each communicating a first space surrounded by the photomask and the framed pellicle with a second space outside of the framed pellicle, and the imager is configured to direct an exposure light through the pellicle membrane and the photomask and onto the photoresist layer. Such ventilator comprises means for directing gas flow from within the first space to outside the framed pellicle through the first aperture while the imager simultaneously directs the exposure light through the pellicle membrane and the photomask and onto the photoresist layer. The gas flow directing means may include a positive pressure gas source configured to fluidicly communicate with the first aperture. The gas flow directing means may include a vacuum source configured to fluidicly communicate with the second aperture. The gas flow directing means may include a positive pressure gas source configured to fluidicly communicate with the first aperture and a vacuum source configured to fluidicly communicate with the second aperture. The ventilator may further comprise a receptacle configured to receive at least one of the substrate and the photomask. The ventilator may further comprise a receptacle configured to orient at least one of the photomask and the framed pellicle relative to the substrate. The gas flow directing means may comprise means for filtering gas flowing between the first and second spaces.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of exposing a photoresist layer on a substrate surface to ultraviolet light through a photomask, comprising:
mounting a framed pellicle on the photomask, the framed pellicle comprising a pellicle frame and a pellicle membrane coupled to the pellicle frame, the pellicle frame having first and second apertures each communicating a first space surrounded by the photomask and the framed pellicle with a second space outside of the framed pellicle; and
flowing gas from within the first space through the first aperture to outside the framed pellicle while simultaneously exposing the photoresist layer to ultraviolet light through the pellicle membrane and the photomask;
wherein flowing gas from the first space through the first aperture to outside the framed pellicle comprises providing a tube external to the framed pellicle, the tube having an opening aligned with the first aperture such that a positive pressure gas flow through the tube creates a suction force urging gas out of the first space through the first aperture and the opening and into the tube.

2. The method of claim 1 wherein flowing gas from the first space through the first aperture to outside the framed pellicle comprises communicating a positive pressure gas source with one end of the tube.

3. An exposure apparatus, comprising:
a chamber configured to accommodate a substrate and a photomask, wherein the substrate includes a photoresist layer located thereon, the photomask includes a framed pellicle mounted thereon, the framed pellicle includes a pellicle frame and a pellicle membrane coupled to the pellicle frame, and the pellicle frame includes first and second apertures each communicating a first space surrounded by the photomask and the framed pellicle with a second space outside of the framed pellicle;
an imager configured to direct an exposure light through the pellicle membrane and the photomask and onto the photoresist layer; and
a ventilator configured to direct gas flow from within the first space to outside the framed pellicle through the first aperture while the imager simultaneously directs the exposure light through the pellicle membrane and photomask and onto the photoresist layer;
wherein the ventilator comprises a tube external to the framed pellicle, the tube having an opening aligned with the first aperture such that positive pressure gas flow through the tube creates a suction force urging gas out of the first space through the first aperture and the opening and into the tube.

4. The exposure apparatus of claim 3 wherein the ventilator includes a positive pressure gas source in fluidic communication with one end of the tube.

5. The exposure apparatus of claim 3 further comprising a receptacle configured to receive the substrate.

6. The exposure apparatus of claim 3 further comprising a receptacle configured to receive the photomask.

7. The exposure apparatus of claim 3 wherein the ventilator includes a receptacle configured to align at least one of the photomask and the framed pellicle relative to the substrate.

8. The exposure apparatus of claim 3 wherein the ventilator includes a filter configured to filter gas flowing between the first and second spaces.

9. A ventilator for use with an exposure apparatus having a chamber and an imager, wherein the chamber is configured to accommodate a substrate and a photomask, the substrate includes a photoresist layer located thereon, the photomask includes a framed pellicle mounted thereon, the framed pellicle includes a pellicle frame and a pellicle membrane coupled to the pellicle frame, the pellicle frame includes first and second apertures each communicating a first space surrounded by the photomask and the framed pellicle with a second space outside of the framed pellicle, and the imager is configured to direct an exposure light through the pellicle membrane and the photomask and onto the photoresist layer, the ventilator comprising:
means for directing gas flow from within the first space to outside the framed pellicle through the first aperture while the imager simultaneously directs the exposure light through the pellicle membrane and the photomask and onto the photoresist layer;

wherein the gas flow directing means comprises a tube external to the framed pellicle, the tube having an opening aligned with the first aperture such that a positive pressure gas flow through the tube creates a suction force urging gas out of the first space through the first aperture and the opening and into the tube.

10. The ventilator of claim 9 wherein the gas flow directing means includes a positive pressure gas source configured to fluidicly communicate with one end of the tube.

11. The ventilator of claim 9 further comprising a receptacle configured to receive at least one of the substrate and the photomask.

12. The ventilator of claim 9 further comprising a receptacle configured to orient at least one of the photomask and the framed pellicle relative to the substrate.

13. The ventilator of claim 9 wherein the gas flow directing means comprises means for filtering gas flowing between the first and second spaces.

14. The method of claim 1 further comprising providing a receptacle configured to receive at least one of the substrate and the photomask.

15. The method of claim 1 further comprising providing a receptacle configured to orient at least one of the photomask and the framed pellicle relative to the substrate.

16. The method of claim 1 further comprising filtering gas flowing between the first and second spaces.

* * * * *